US012748157B2

(12) United States Patent
Summerville et al.

(10) Patent No.: US 12,748,157 B2
(45) Date of Patent: Sep. 29, 2026

(54) BATTERY STORAGE MAINTENANCE

(71) Applicant: Lenovo (Singapore) Pte. Ltd., Singapore (SG)

(72) Inventors: Mark K. Summerville, Apex, NC (US); Fang Feng, Cary, NC (US); Charles Byrd, Snow Camp, NC (US); Thomas E. Annunziata, Raleigh, NC (US); Timothy Richard Scott, Cary, NC (US)

(73) Assignee: Lenovo (United States) Inc., Morrisville, NC (US)

( * ) Notice: Subject to any disclaimer, the term of this patent is extended or adjusted under 35 U.S.C. 154(b) by 164 days.

(21) Appl. No.: 18/745,579

(22) Filed: Jun. 17, 2024

(65) Prior Publication Data

US 2025/0383407 A1 Dec. 18, 2025

(51) Int. Cl.

| | |
|---|---|
| ***G01R 31/387*** | (2019.01) |
| ***G01R 31/367*** | (2019.01) |
| ***G01R 31/371*** | (2019.01) |
| ***G01R 31/374*** | (2019.01) |
| ***G01R 31/392*** | (2019.01) |

(52) U.S. Cl.

CPC ......... *G01R 31/387* (2019.01); *G01R 31/367* (2019.01); *G01R 31/371* (2019.01); *G01R 31/374* (2019.01); *G01R 31/392* (2019.01)

(58) Field of Classification Search

CPC ...... G01R 31/00; G01R 31/36; G01R 31/367; G01R 31/371; G01R 31/374; G01R 31/385; G01R 31/387; G01R 31/392

USPC .................................................. 324/425, 426

See application file for complete search history.

(56) References Cited

U.S. PATENT DOCUMENTS

| | | | | |
|---|---|---|---|---|
| 8,970,178 | B2 * | 3/2015 | Berkowitz ............ | H01M 10/44 320/141 |
| 9,702,940 | B2 * | 7/2017 | Maluf ...................... | B60L 58/12 |
| 10,067,198 | B2 * | 9/2018 | Maluf ................... | H02J 7/0048 |
| 2012/0200266 | A1 * | 8/2012 | Berkowitz ............ | H01M 10/44 320/139 |

FOREIGN PATENT DOCUMENTS

| | | | | |
|---|---|---|---|---|
| CN | 102170163 A | * | 8/2011 | .......... H01M 10/482 |
| CN | 107102271 A | * | 8/2017 | ........... G01R 31/367 |

(Continued)

*Primary Examiner* — Hoai-An D. Nguyen
(74) *Attorney, Agent, or Firm* — Kunzler Needham Hilton

(57) ABSTRACT

Apparatuses, methods, and computer program products are disclosed for battery storage maintenance is disclosed. An apparatus includes a processor and a memory that stores code executable by the processor to determine one or more battery characteristics for at least one battery of the apparatus, the battery characteristics associated with a charge of the at least one battery. The code is executable by the processor to determine a storage period for the apparatus, the storage period defining a period of time where the apparatus is not in use. The code is executable by the processor to calculate a storage battery charge level based on the one or more battery characteristics and the storage period, the storage battery charge level comprising a minimum battery charge level that allows operation of the apparatus after the storage period without providing additional charge to the at least one battery during the storage period.

20 Claims, 5 Drawing Sheets

(56) References Cited

FOREIGN PATENT DOCUMENTS

| | | | | | |
|---|---|---|---|---|---|
| CN | 104868519 | B | * | 11/2018 | .............. B60L 58/22 |
| CN | 117907835 | A | * | 4/2024 | ........... G01R 31/392 |
| JP | 3720290 | B2 | * | 11/2005 | ......... G01R 31/3842 |

* cited by examiner

BATTERY STORAGE MAINTENANCE

FIELD

The subject matter disclosed herein relates to electronic devices and more particularly relates to battery storage maintenance for electronic devices.

BACKGROUND

Electronic devices such as computers may run on battery power. Certain organizations or users may store electronic devices for extended periods of time; however, it may be unknown how much to charge the battery prior to the extended storage period to maintain the integrity of the battery while also ensuring that the device is usable after the storage period.

BRIEF SUMMARY

An apparatus for battery storage maintenance is disclosed. A method and computer program product also perform the functions of the method. An apparatus, in one embodiment, includes a processor and a memory that stores code executable by the processor to determine one or more battery characteristics for at least one battery of the apparatus, the battery characteristics associated with a charge of the at least one battery. In one embodiment, the code is executable by the processor to determine a storage period for the apparatus, the storage period defining a period of time where the apparatus is not in use. In one embodiment, the code is executable by the processor to calculate a storage battery charge level based on the one or more battery characteristics and the storage period, the storage battery charge level comprising a minimum battery charge level that allows operation of the apparatus after the storage period without providing additional charge to the at least one battery during the storage period.

In one embodiment, a method includes determining one or more battery characteristics for at least one battery of a device, the battery characteristics associated with a charge of the at least one battery. In one embodiment, the method includes determining a storage period for the device, the storage period defining a period of time where the device is not in use. In one embodiment, the method includes calculating a storage battery charge level based on the one or more battery characteristics and the storage period, the storage battery charge level comprising a minimum battery charge level that allows operation of the device after the storage period without providing additional charge to the at least one battery during the storage period.

In one embodiment, a program product comprising a non-transitory computer readable storage medium storing code. In one embodiment, the code is configured to be executable by a processor to perform operations including determining one or more battery characteristics for at least one battery of a device, the battery characteristics associated with a charge of the at least one battery. In one embodiment, the code is configured to be executable by a processor to perform operations including determining a storage period for the device, the storage period defining a period of time where the device is not in use. In one embodiment, the code is configured to be executable by a processor to perform operations including calculating a storage battery charge level based on the one or more battery characteristics and the storage period, the storage battery charge level comprising a minimum battery charge level that allows operation of the device after the storage period without providing additional charge to the at least one battery during the storage period.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
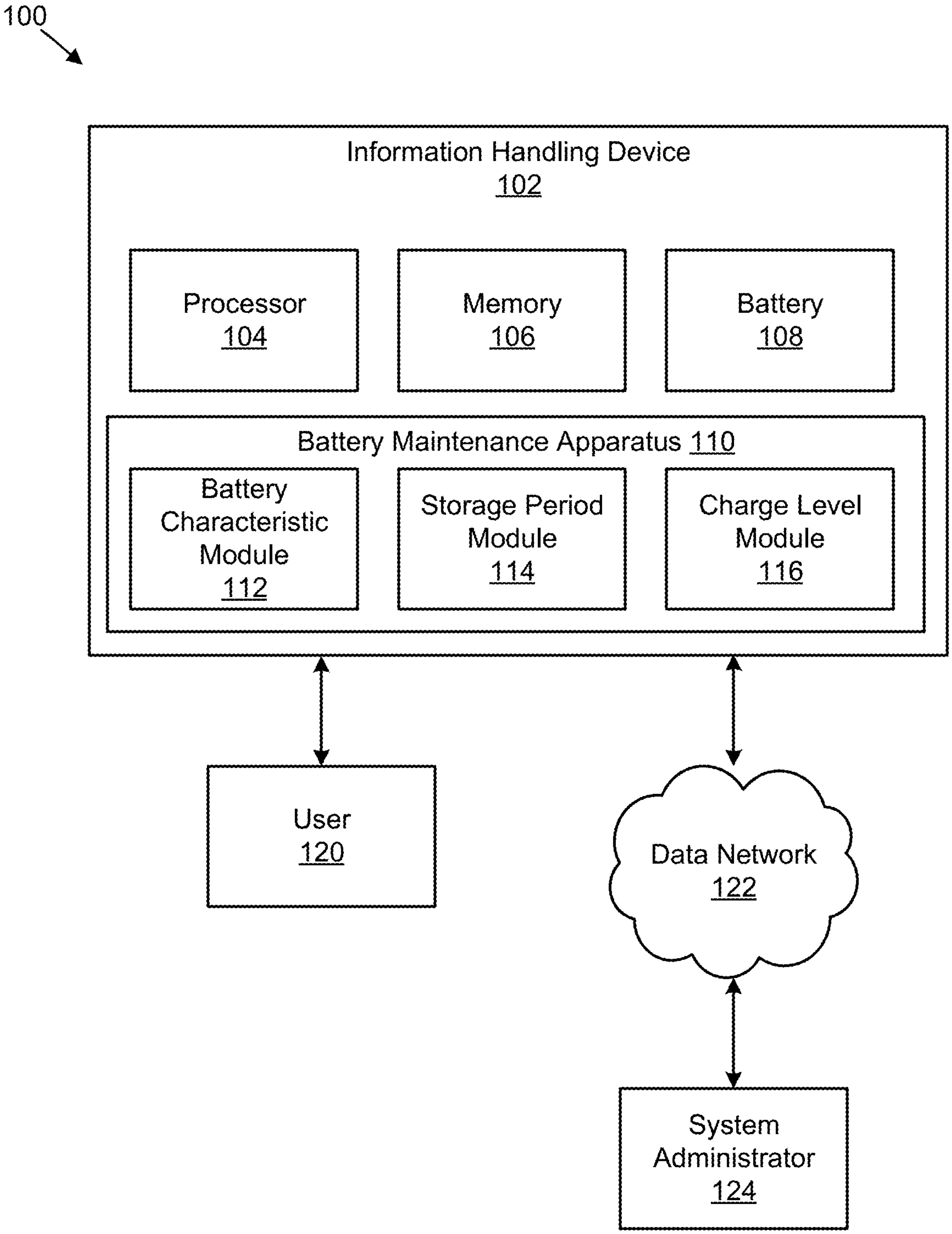
FIG. 1 is a schematic block diagram illustrating a system for battery storage maintenance, according to various embodiments.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices, in some embodiments, are tangible, non-transitory, and/or non-transmission.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

More specific examples (a non-exhaustive list) of the storage device would include the following: an electrical connection having one or more wires, a portable computer diskette, a hard disk, a random access memory ("RAM"), a read-only memory ("ROM"), an erasable programmable read-only memory ("EPROM" or Flash memory), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C. As used herein, "a member selected from the group consisting of A, B, and C and combinations thereof" includes only A, only B, only C, a combination of A and B, a combination of B and C, a combination of A and C or a combination of A, B and C.

An apparatus for battery storage maintenance is disclosed. A method and computer program product also perform the functions of the method. An apparatus, in one embodiment, includes a processor and a memory that stores code executable by the processor to determine one or more battery characteristics for at least one battery of the apparatus, the battery characteristics associated with a charge of the at least one battery. In one embodiment, the code is executable by the processor to determine a storage period for the apparatus, the storage period defining a period of time where the apparatus is not in use. In one embodiment, the code is executable by the processor to calculate a storage battery charge level based on the one or more battery characteristics and the storage period, the storage battery charge level comprising a minimum battery charge level that allows operation of the apparatus after the storage period without providing additional charge to the at least one battery during the storage period.

In one embodiment, the one or more battery characteristics comprises an age of the at least one battery of the apparatus. In one embodiment, the one or more battery characteristics comprises a maximum charge capacity of the at least one battery of the apparatus. In one embodiment, the one or more battery characteristics comprises a usage value of the at least one battery of the apparatus.

In one embodiment, the storage period is defined by a user. In one embodiment, the storage period is defined by a system administrator. In one embodiment, the code is executable by the processor to set a standard battery charge level to the storage battery charge level for a threshold time period prior to a start of the storage period. In one embodiment, the threshold time period is at least two days.

In one embodiment, the code is executable by the processor to provide a notification that the apparatus will not be operable at an end of the storage period based on the one or more battery characteristics. In one embodiment, the notification comprises charge information for the at least one battery based on the one or more battery characteristics.

In one embodiment, a method includes determining one or more battery characteristics for at least one battery of a device, the battery characteristics associated with a charge of the at least one battery. In one embodiment, the method includes determining a storage period for the device, the storage period defining a period of time where the device is not in use. In one embodiment, the method includes calculating a storage battery charge level based on the one or more battery characteristics and the storage period, the storage battery charge level comprising a minimum battery charge level that allows operation of the device after the storage period without providing additional charge to the at least one battery during the storage period.

In one embodiment, a program product comprising a non-transitory computer readable storage medium storing code. In one embodiment, the code is configured to be executable by a processor to perform operations including determining one or more battery characteristics for at least one battery of a device, the battery characteristics associated with a charge of the at least one battery. In one embodiment, the code is configured to be executable by a processor to perform operations including determining a storage period for the device, the storage period defining a period of time where the device is not in use. In one embodiment, the code is configured to be executable by a processor to perform operations including calculating a storage battery charge level based on the one or more battery characteristics and the storage period, the storage battery charge level comprising a minimum battery charge level that allows operation of the device after the storage period without providing additional charge to the at least one battery during the storage period.

FIG. 1 is a schematic block diagram illustrating a system for battery storage maintenance, according to various embodiments. In one embodiment, the information handling device 102 may be embodied as one or more of a desktop computer, a laptop computer, a tablet computer, a smart phone, a smart speaker (e.g., Amazon Echo®, Google Home®, Apple HomePod®), an Internet of Things device, a security system, a set-top box, a gaming console, a smart TV, a smart watch, a fitness band or other wearable activity tracking device, an optical head-mounted display (e.g., a virtual reality headset, smart glasses, head phones, or the like), a High-Definition Multimedia Interface ("HDMI") or other electronic display dongle, a personal digital assistant, a digital camera, a video camera, or another computing device comprising a processor (e.g., a central processing unit ("CPU"), a processor core, a field programmable gate array ("FPGA") or other programmable logic, an application specific integrated circuit ("ASIC"), a controller, a microcontroller, and/or another semiconductor integrated circuit device), a volatile memory, and/or a non-volatile storage medium, a display, a connection to a display, and/or the like.

The information handling device 102 includes one or more processors 104, memories 106, batteries 108, and battery maintenance apparatuses 110. In one embodiment, the processor 104 may include a CPU, a processor core, a graphics processing unit (GPU), or the like. In one embodiment, the processor 104 is configured to execute instructions of a computer program, such as arithmetic, logic, controlling, and input/output (I/O) operations.

In one embodiment, the processor 104 includes and/or is communicatively coupled to one or more memory 106. The memory 106 may include one or more volatile memory media, which may include but is not limited to random access memory ("RAM"), dynamic RAM ("DRAM"), cache, or the like. In one embodiment, processor 104 includes and/or is communicatively coupled to one or more non-volatile memory media, which may include but is not limited to: NAND flash memory, NOR flash memory, nano random access memory (nano RAM or "NRAM"), nanocrystal wire-based memory, silicon-oxide based sub-10 nanometer process memory, graphene memory, Silicon-Oxide-Nitride-Oxide-Silicon ("SONOS"), resistive RAM ("RRAM"), programmable metallization cell ("PMC"), conductive-bridging RAM ("CBRAM"), magneto-resistive RAM ("MRAM"), dynamic RAM ("DRAM"), phase change RAM ("PRAM" or "PCM"), magnetic storage media (e.g., hard disk, tape), optical storage media, or the like.

In one embodiment, the information handling device 102 includes one or more batteries 108. As used herein, a battery 108 may include a rechargeable device that supplies power to the information handling device 102. The battery 108 allows the information handling device 102 to operate without being connected to a constant power source, e.g., a wall power outlet. The battery 108 may include a Lithium-Ion (Li-ion) battery, a Lithium-Polymer (LiPo) battery, a Nickel-Cadmium (NiCad) battery, and/or a Nickel-Metal Hydride (NiMH) battery.

In general, the battery maintenance apparatus 110, in one embodiment, is configured to plan and manage a charge storage level for a battery of an information handling device 102 that is being stored (e.g., unused) for a period of time, e.g., one month, three months, six months, a year, or the like. Many organizations store their information handling devices 102 for a period, say a school district storing their student laptops in a warehouse for the summer. Batteries in these systems may be best maintained at a predetermined charge level, e.g., at about a 40% charge level going into these storage periods.

The battery maintenance apparatus 110, in one embodiment, is configured to determine one or more battery characteristics for at least one battery of the information handling device 102, determine a storage period for the information handling device 102, and calculate a storage battery charge level based on the one or more battery characteristics and the storage period. As used herein, the storage battery charge level is a minimum battery charge level that allows operation of the apparatus after the storage period without providing additional charge to the at least one battery during the storage period.

In certain embodiments, the battery maintenance apparatus 110 may include a hardware device such as a secure hardware dongle or other hardware appliance device (e.g., a set-top box, a network appliance, or the like) that attaches to a device such as a head mounted display, a laptop computer, a server, a tablet computer, a smart phone, a security system, a network router or switch, or the like, either by a wired connection (e.g., a universal serial bus ("USB") connection) or a wireless connection (e.g., Bluetooth®, Wi-Fi, near-field communication ("NFC"), or the like); that attaches to an electronic display device (e.g., a television or monitor using an HDMI port, a DisplayPort port, a Mini DisplayPort port, VGA port, DVI port, or the like); and/or the like. A hardware appliance of the battery maintenance apparatus 110 may include a power interface, a wired and/or wireless network interface, a graphical interface that attaches to a display, and/or a semiconductor integrated circuit device as described below, configured to perform the functions described herein with regard to the battery maintenance apparatus 110.

The battery maintenance apparatus 110, in such an embodiment, may include a semiconductor integrated circuit device (e.g., one or more chips, die, or other discrete logic hardware), or the like, such as a field-programmable gate array ("FPGA") or other programmable logic, firmware for an FPGA or other programmable logic, microcode for execution on a microcontroller, an application-specific integrated circuit ("ASIC"), a processor, a processor core, or the like. In one embodiment, the battery maintenance apparatus 110 may be mounted on a printed circuit board with one or more electrical lines or connections (e.g., to volatile memory, a non-volatile storage medium, a network interface, a peripheral device, a graphical/display interface, or the like). The hardware appliance may include one or more pins, pads, or other electrical connections configured to send and receive data (e.g., in communication with one or more electrical lines of a printed circuit board or the like), and one or more hardware circuits and/or other electrical circuits configured to perform various functions of the battery maintenance apparatus 110.

In one embodiment, the battery maintenance apparatus 110 includes an instance of a battery characteristic module 112. The battery characteristic module 112, in one embodiment, is configured to determine one or more battery characteristics for at least one battery of the information handling device 102. The one or more battery characteristics, as used herein, may include values, parameters, and/or other factors that describe a state of a battery. For example, the one or more battery characteristics may include a manufacture date for the battery 108, a usage time of the battery 108 (e.g., an active usage time, a standby usage time, or the like), an estimated remaining lifetime of the battery 108, a rated lifetime of the battery 108, a size of the battery 108, a type of battery 108, an estimated number of recharge cycles for the battery 108, an age of the battery 108, a maximum charge capacity of the battery 108, and/or the like.

The battery characteristic module 112, for instance, may interface with, communicate with, or otherwise access a firmware (e.g., a basic input/output system (BIOS) or other firmware) for a battery 108 to determine various characteristics, settings, parameters, or the like for the battery 108 such as the manufacturer, the date of manufacture, the rated lifetime of the battery 108, the size of the battery 108, and/or the like. The battery characteristic module 112 may use the acquired information to determine various parameters such as an estimated remaining life of the battery 108.

In one embodiment, the storage period module 114 is configured to determine a storage period for the information handling device 102. As used herein, the storage period is a period of time where the information handling device 102 is not in use. For example, a school district may store the devices that administrators, teachers, and students use for extended periods of time, e.g., for summer vacation, which may last one month, three months, six months, or the like.

The storage period may be set by users, e.g., by a system administrator 124, in settings, e.g., in firmware, operating system, or other application settings. In such an embodiment, the storage period module 114 may access the settings via an application programming interface (API) or other interface. In one embodiment, the storage period module 114 may reference an external resource such as a calendar (e.g., a school district calendar), an online source (e.g., a website), and/or the like to determine the storage period for the information handling device 102. In such an embodiment, the storage period module 114 may determine, estimate, or forecast a proposed storage period and present the proposed storage period to a user, e.g., a system administrator 124, for confirmation or feedback on the proposed storage period. For example, the storage period module 114 may determine the first day and last day of summer vacation for a school district based on an online district calendar and calculate the storage period based on the determined dates.

In one embodiment, the charge level module 116 is configured to calculate a storage battery charge level based on the one or more battery characteristics and the storage period. The storage battery charge level, as used herein, may refer to an (optimal) charge level for the battery 108 that the battery 108 is charged to prior to the information handling device 102 being stored for the storage period. The storage battery charge level is set at a level that allows the battery 108 to power the information handling device 102 after the storage period so that the information handling device 102 is usable after the storage period.

In one embodiment, the charge level module 116 uses the one or more battery characteristics to determine the storage battery charge level. For instance, an older battery 108 or a battery 108 that has been active for a threshold period of time may require a higher storage battery charge level than a newer or less-used battery 108. Further, different types of batteries 108 (e.g., batteries made of different materials) may have different storage battery charge levels. Further, batteries 108 with different sizes or maximum charge levels may have different storage battery charge levels. In one embodiment, if multiple batteries 108 are present in the information handling device 102, the charge level module 116 may determine storage battery charge levels for each of the batteries 108. In one embodiment, the charge level module 116 may use output from a battery health process on the information handling device 102 that monitors the health, status, and/or the like of the battery 108.

In one embodiment, the charge level module 116 determines the storage battery charge level based on the storage period. For instance, a longer storage period may require a higher storage battery charge level than a shorter storage period. The charge level module 116 may further account for the potential of the storage period going longer than estimated. For instance, the charge level module 116 may build an extra week or two into the storage battery charge level, may add an extra 10% to the determined storage battery charge level, and/or the like. In one embodiment, after the storage period is over, the charge level module 116 may disable the storage battery charge level so that the battery 108 can be charged normally. In one embodiment, the storage battery charge level may be disabled or reset in response to detecting that A/C power has been removed and reconnected.

In one embodiment, the charge level module 116 may determine the storage battery charge level a threshold period of time prior to the start of the storage period. For instance, the charge level module 116 may determine the storage battery charge level a day, two days, a week, a month, or the like prior to the start of the storage period. In such an embodiment, the charge level module 116 may set the maximum charge level for the battery 108 to the storage battery charge level, e.g., in firmware or other settings for the battery 108 via an API, such that the battery 108 cannot be charged beyond the maximum charge level.

In one embodiment, the charge level module 116 may determine, based on the battery characteristics and the storage period, that the battery 108 will not maintain a charge at the determined storage battery charge level such that the information handling device 102 will be inoperable at the end of the storage period. For instance, the charge level module 116 may determine a storage battery charge level that is not achievable for the battery 108, or a storage battery charge level that the battery 108 cannot attain. Accordingly, the charge level module 116 may trigger an error, a notification, a message, an alert, or the like, which may be transmitted, sent, pushed, or the like to a user 120 or system administrator 124. The notification may include information about the battery 108 such as charge information, characteristics that impact how the storage battery charge level is determined for the battery 108, and/or the like.

In one embodiment, the battery maintenance apparatus 110 may be part of a battery controller software, driver, or other application that manages or controls the battery 108 for an information handling device 102. The battery maintenance apparatus 110 may be located on a server that is communicatively coupled to a plurality of information handling devices 102, e.g., a fleet or array of devices, to remotely control and manage batteries 108 for a plurality of information handling devices 102. For instance, the battery maintenance apparatus 110 may provide hooks, interfaces, APIs, or the like for IT management software such as LANDesk® to remotely set configuration settings, e.g., the storage period and/or the storage battery charge level.

In one embodiment, the system 100 may include a data network 122 that facilitates communications between the information handling device 102 and remote or external devices. The data network 122, in one embodiment, includes a digital communication network that transmits digital communications. The data network 122 may include a wireless network, such as a wireless cellular network, a local wireless network, such as a Wi-Fi network, a Bluetooth® network, a near-field communication ("NFC") network, an ad hoc network, and/or the like. The data network 122 may include a wide area network ("WAN"), a storage area network ("SAN"), a local area network ("LAN") (e.g., a home network), an optical fiber network, the internet, or other digital communication network. The data network 122 may include two or more networks. The data network 122 may include one or more servers, routers, switches, and/or other networking equipment. The data network 122 may also include one or more computer readable storage media, such as a hard disk drive, an optical drive, non-volatile memory, RAM, or the like.

The wireless connection may be a mobile telephone network. The wireless connection may also employ a Wi-Fi network based on any one of the Institute of Electrical and Electronics Engineers ("IEEE") 802.11 standards. Alternatively, the wireless connection may be a Bluetooth® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® (ASTM®), the DASH7™ Alliance, and EPCGlobal™.

Alternatively, the wireless connection may employ a ZigBee® connection based on the IEEE 802 standard. In one embodiment, the wireless connection employs a Z-Wave® connection as designed by Sigma Designs®. Alternatively, the wireless connection may employ an ANT® and/or ANT+® connection as defined by Dynastream® Innovations Inc. of Cochrane, Canada.

The wireless connection may be an infrared connection including connections conforming at least to the Infrared Physical Layer Specification ("IrPHY") as defined by the Infrared Data Association® ("IrDA"®). Alternatively, the wireless connection may be a cellular telephone network communication. All standards and/or connection types include the latest version and revision of the standard and/or connection type as of the filing date of this application.

Figure 2:
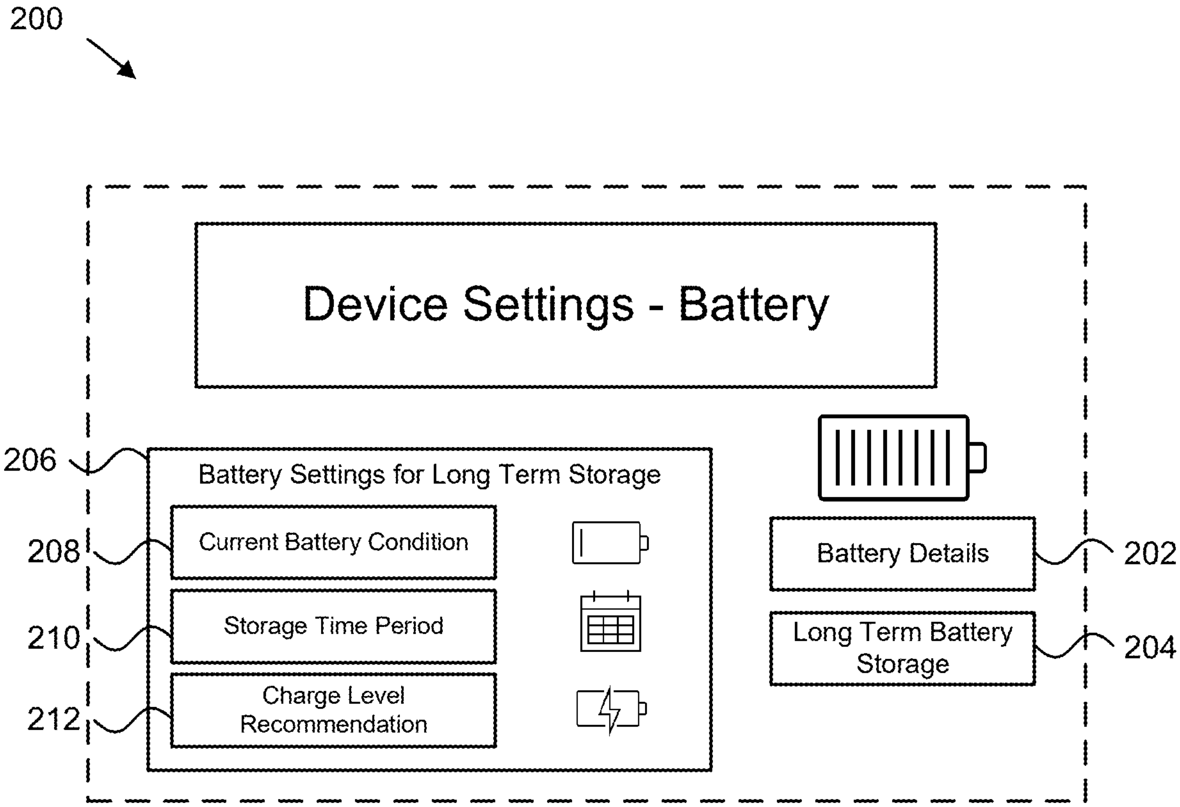
FIG. 2 is a schematic block diagram illustrating an interface for battery storage maintenance, according to various embodiments.

FIG. 2 is a schematic block diagram illustrating an interface 200 for battery storage maintenance, according to various embodiments. In one embodiment, the interface 200 may be provided by a battery manager application, controller, or other software. The interface 200 may provide details regarding the state of the battery 108, the long-term battery storage settings for the battery 108, and/or the like. For instance, a user may select the "battery details" button 202 to see information regarding the battery 108 in the device such as the battery type, age, maximum charge level, manufacturer, model, and/or the like.

In one embodiment, a user may select the "long term battery storage" button 204 to see the long term battery storage settings 206 for the battery 108. The long term battery storage settings 206 may include a "current battery condition" 208 option to see the current condition of the battery 108, including the current charge level, the health of the battery 108, the time remaining on the current charge, and/or the like. The "storage time period" 210 option may be selectable to see the storage period that the storage period module 114 determined, to manually set the storage period (e.g., in increments of days, weeks, months, or the like, or by using an interactive calendar or time selection interface to specify the storage period on a more granular level). In one embodiment, the "charge level recommendation" 212 option that is selectable to view the storage battery charge level that the charge level module 116 determines and/or set the storage battery charge level for the battery 108, e.g., the interface may include a slider to set the storage battery charge level to 40%, 50%, 60%, and so on. In one embodiment, a system administrator 124 may lock these settings so that a user 120 cannot manually adjust the settings to override the settings that the battery maintenance apparatus 110 determines.

Figure 3:
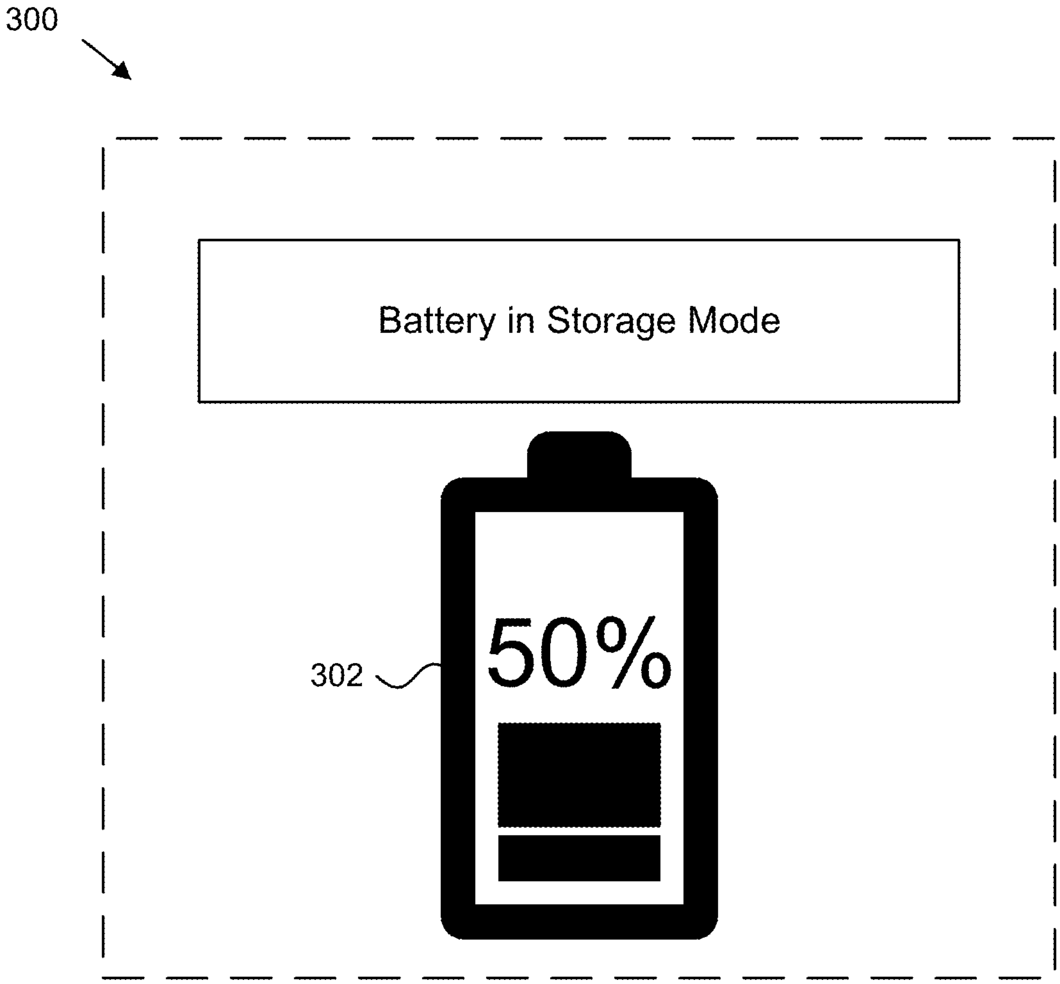
FIG. 3 is a schematic block diagram illustrating another interface for battery storage maintenance, according to various embodiments.

FIG. 3 is a schematic block diagram illustrating another interface 300 for battery storage maintenance, according to various embodiments. The interface 300 in FIG. 3 may be an example of an interface 300 that is shown while the information handling device is in storage mode, e.g., where the battery 108 has been charged to the storage battery charge level for storage. The interface 300 may show a current charge level 302 for the battery 108. The interface may also show other information including a beginning charge level, a time remaining in the storage period, an estimated time that the battery's charge will last, and/or the like.

Figure 4:
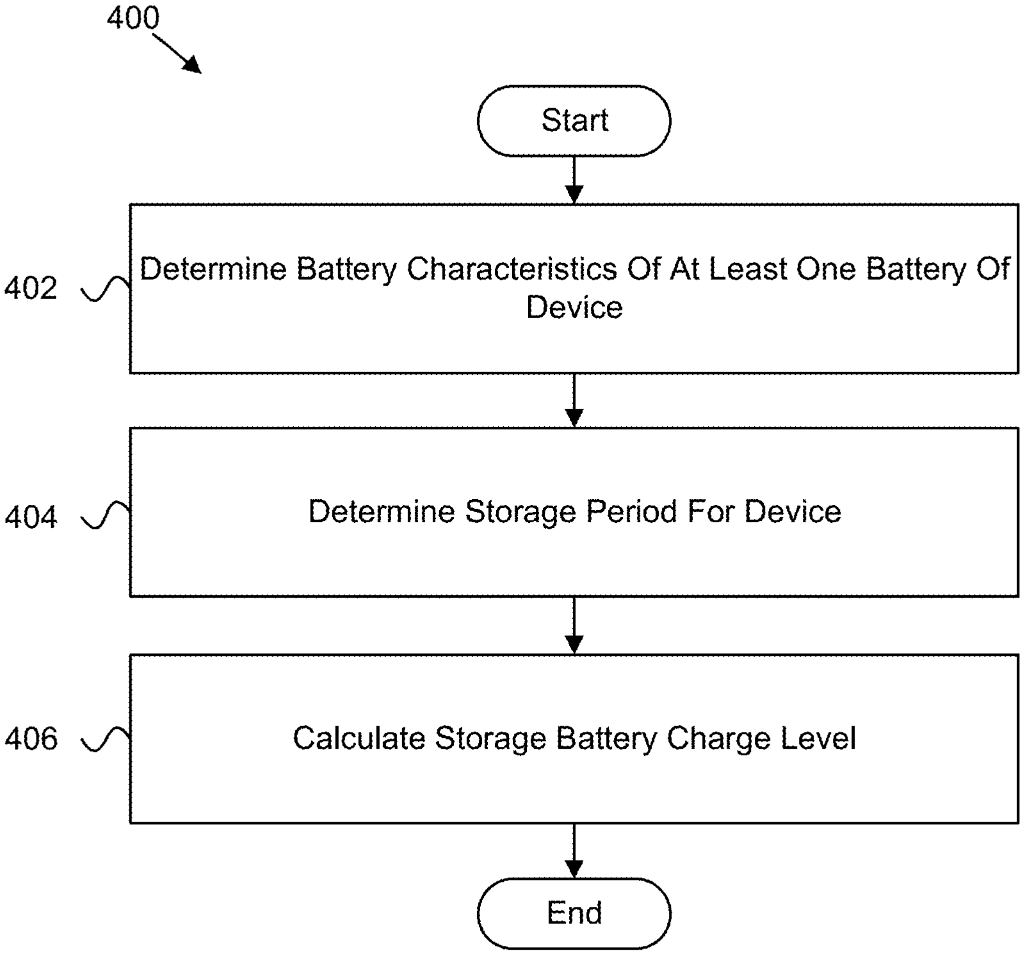
FIG. 4 is a schematic flow chart diagram illustrating a method for battery storage maintenance, according to various embodiments.

FIG. 4 is a schematic flow chart diagram illustrating a method for battery storage maintenance, according to various embodiments. In one embodiment, the method 400 is performed by a processor 104, a battery maintenance apparatus 110, a battery characteristic module 112, a storage period module 114, a charge level module 116, or the like.

In one embodiment, the method 400 begins and determines 402 one or more battery characteristics for at least one battery of the apparatus, the battery characteristics associated with a charge of the at least one battery. In one embodiment, the method 400 determines 404 a storage period for the apparatus, the storage period defining a period of time where the apparatus is not in use. In one embodiment, the method 400 calculates 406 a storage battery charge level based on the one or more battery characteristics and the storage period, the storage battery charge level comprising a minimum battery charge level that allows operation of the apparatus after the storage period without providing additional charge to the at least one battery during the storage period, and the method 400 ends.

Figure 5:
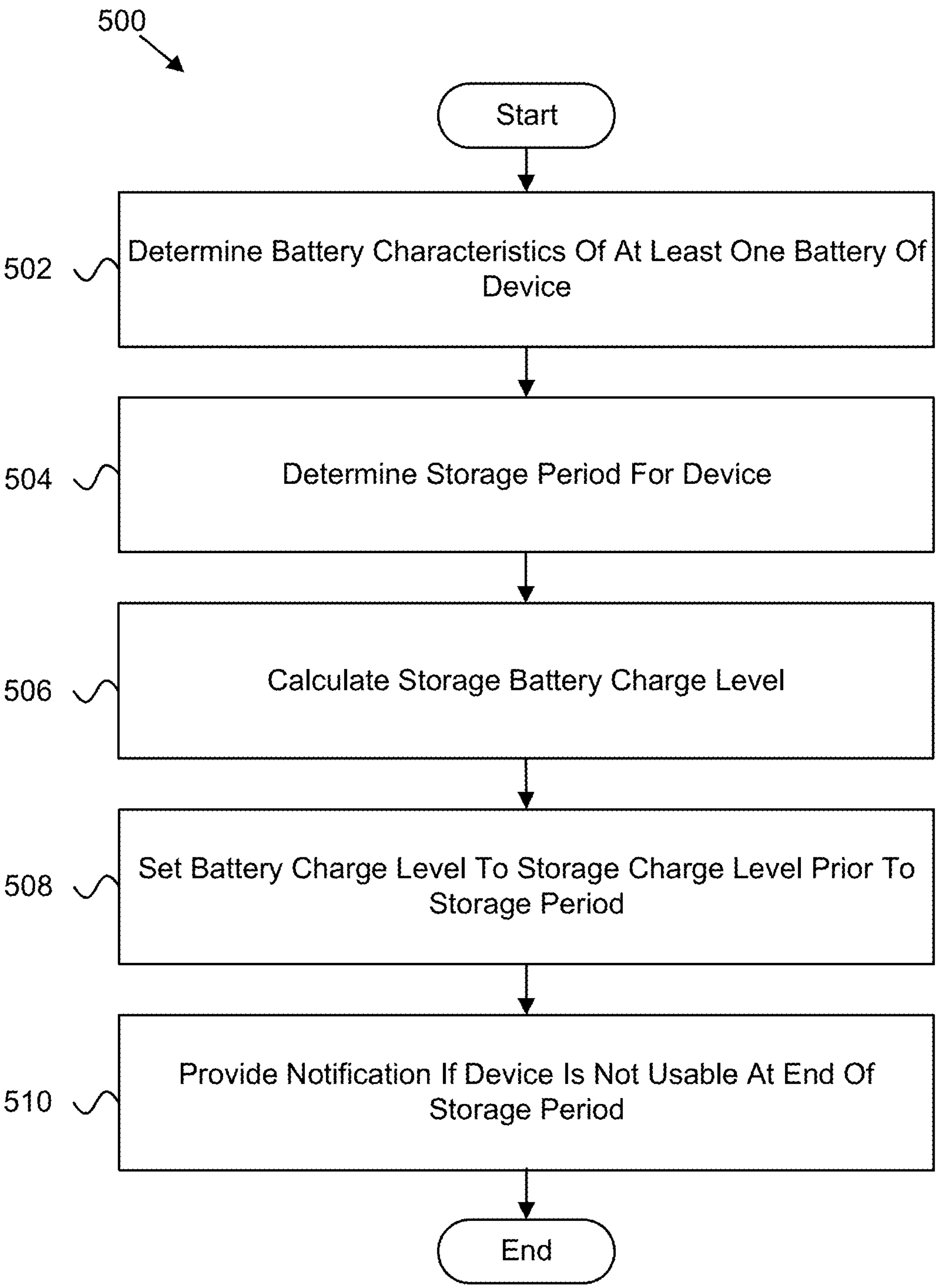
FIG. 5 is a schematic flow chart diagram illustrating a method for battery storage maintenance, according to various embodiments.

FIG. 5 is a schematic flow chart diagram illustrating a method for battery storage maintenance, according to various embodiments. In one embodiment, the method 500 is performed by a processor 104, a battery maintenance apparatus 110, a battery characteristic module 112, a storage period module 114, a charge level module 116, or the like.

In one embodiment, the method 500 begins and determines 502 one or more battery characteristics for at least one battery of the apparatus, the battery characteristics associated with a charge of the at least one battery. In one embodiment, the method 500 determines 504 a storage period for the apparatus, the storage period defining a period of time where the apparatus is not in use. In one embodiment, the method 500 calculates 506 a storage battery charge level based on the one or more battery characteristics and the storage period, the storage battery charge level comprising a minimum battery charge level that allows operation of the apparatus after the storage period without providing additional charge to the at least one battery during the storage period.

In one embodiment, the method 500 sets 508 the battery charge level to the battery storage charge level prior to the storage period. In one embodiment, the method 500 provides 510 a notification if the information handling device 102 will not be usable at the end of the storage period, and the method 500 ends.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An apparatus comprising:

a processor; and a memory that stores code executable by the processor to:

determine, via a battery characteristic module, one or more battery characteristics for at least one battery of the apparatus, the battery characteristics associated with a charge of the at least one battery;

determine, via a storage period module, a storage period for the apparatus, the storage period defining a period of time where the apparatus is not in use;

calculate, via a charge level module, a storage battery charge level based on the one or more battery characteristics and the storage period, the storage battery charge level comprising a minimum battery charge level that allows operation of the apparatus after the storage period without providing additional charge to the at least one battery during the storage period; and set, via the charge level module that interfaces with firmware of the at least one battery and prior to the storage period, a maximum charge level of the at least one battery to the storage battery charge level, such that the at least one battery is prevented from being charged beyond the storage battery charge level.

2. The apparatus of claim 1, wherein the one or more battery characteristics comprises an age of the at least one battery of the apparatus.

3. The apparatus of claim 1, wherein the one or more battery characteristics comprises a maximum charge capacity of the at least one battery of the apparatus.

4. The apparatus of claim 1, wherein the one or more battery characteristics comprises a usage value of the at least one battery of the apparatus.

5. The apparatus of claim 1, wherein the storage period is defined by a user.

6. The apparatus of claim 1, wherein the storage period is defined by a system administrator.

7. The apparatus of claim 1, wherein the code is executable by the processor to set a standard battery charge level to the storage battery charge level for a threshold time period prior to a start of the storage period.

8. The apparatus of claim 7, wherein the threshold time period is at least two days.

9. The apparatus of claim 1, wherein the code is executable by the processor to provide a notification that the apparatus will not be operable at an end of the storage period based on the one or more battery characteristics.

10. The apparatus of claim 9, wherein the notification comprises charge information for the at least one battery based on the one or more battery characteristics.

11. A method comprising:

determining, via a battery characteristic module, one or more battery characteristics for at least one battery of a device, the battery characteristics associated with a charge of the at least one battery;

determining, via a storage period module, a storage period for the device, the storage period defining a period of time where the device is not in use;

calculating, via a charge level module, a storage battery charge level based on the one or more battery characteristics and the storage period, the storage battery charge level comprising a minimum battery charge level that allows operation of the device after the storage period without providing additional charge to the at least one battery during the storage period; and setting, via the charge level module that interfaces with firmware of the at least one battery and prior to the storage period, a maximum charge level of the at least one battery to the storage battery charge level, such that the at least one battery is prevented from being charged beyond the storage battery charge level.

12. The method of claim 11, wherein the one or more battery characteristics comprises an age of the at least one battery of the device.

13. The method of claim 11, wherein the one or more battery characteristics comprises a maximum charge capacity of the at least one battery of the device.

14. The method of claim 11, wherein the one or more battery characteristics comprises a usage value of the at least one battery of the device.

15. The method of claim 11, wherein the storage period is defined by a user.

16. The method of claim 11, wherein the storage period is defined by a system administrator.

17. The method of claim 11, further comprising setting a standard battery charge level to the storage battery charge level for a threshold time period prior to a start of the storage period.

18. The method of claim 11, further comprising providing a notification that the device will not be operable at an end of the storage period based on the one or more battery characteristics.

19. The method of claim 18, wherein the notification comprises charge information for the at least one battery based on the one or more battery characteristics.

20. A program product comprising a non-transitory computer readable storage medium storing code, the code being configured to be executable by a processor to perform operations comprising:

determining, via a battery characteristic module, one or more battery characteristics for at least one battery of a device, the battery characteristics associated with a charge of the at least one battery;

determining, via a storage period module, a storage period for the device, the storage period defining a period of time where the device is not in use;

calculating, via a charge level module, a storage battery charge level based on the one or more battery characteristics and the storage period, the storage battery charge level comprising a minimum battery charge level that allows operation of the device after the storage period without providing additional charge to the at least one battery during the storage period; and setting, via the charge level module that interfaces with firmware of the at least one battery and prior to the storage period, a maximum charge level of the at least one battery to the storage battery charge level, such that the at least one battery is prevented from being charged beyond the storage battery charge level.

* * * * *